United States Patent [19]

Milazzo

[11] Patent Number: 5,389,829
[45] Date of Patent: Feb. 14, 1995

[54] OUTPUT LIMITER FOR CLASS-D BICMOS HEARING AID OUTPUT AMPLIFIER

[75] Inventor: Ciro Milazzo, Santa Cruz, Calif.

[73] Assignee: Exar Corporation, San Jose, Calif.

[21] Appl. No.: 953,901

[22] Filed: Sep. 30, 1992

Related U.S. Application Data

[63] Continuation-in-part of Ser. No. 765,481, Sep. 27, 1991, Pat. No. 5,247,581.

[51] Int. Cl.$^6$ .............................................. H03K 9/08
[52] U.S. Cl. ................................... 327/172; 330/251; 330/10; 327/175; 327/227
[58] Field of Search ............... 307/265, 271, 266, 273; 328/58; 330/10, 251

[56] References Cited

U.S. PATENT DOCUMENTS

| | | | |
|---|---|---|---|
| 3,383,546 | 5/1968 | Chopey | 307/273 |
| 4,689,819 | 8/1987 | Killion | 330/251 |
| 4,754,163 | 6/1988 | Aue et al. | 307/265 |
| 5,220,203 | 6/1993 | McMorrow, Jr. et al. | 307/265 |
| 5,247,581 | 9/1993 | Gurean | 330/10 |

Primary Examiner—Steven L. Stephan
Assistant Examiner—Shawn Riley
Attorney, Agent, or Firm—Townsend and Townsend Khourie and Crew

[57] ABSTRACT

An invention providing a hard limiter between the pulse width modulator and output drive transistors of a class-D amplifier is disclosed. The limiter functions by controlling the duty cycle of the pulse width modulator output, which directly corresponds to the magnitude of the voltage appearing across the load output transducer. The pulse width modulated (PWM) signal is compared to the outputs of a pair of one-shot circuits (single pulse generators). If either the positive pulse or the negative pulse of the PWM signal is shorter than the one-shot pulse, then the one-shot pulse is substituted for the PWM pulse. This sets the maximum and the minimum values for the duty cycle of the PWM signal, thereby limiting the positive and negative value of the corresponding output voltage.

10 Claims, 19 Drawing Sheets

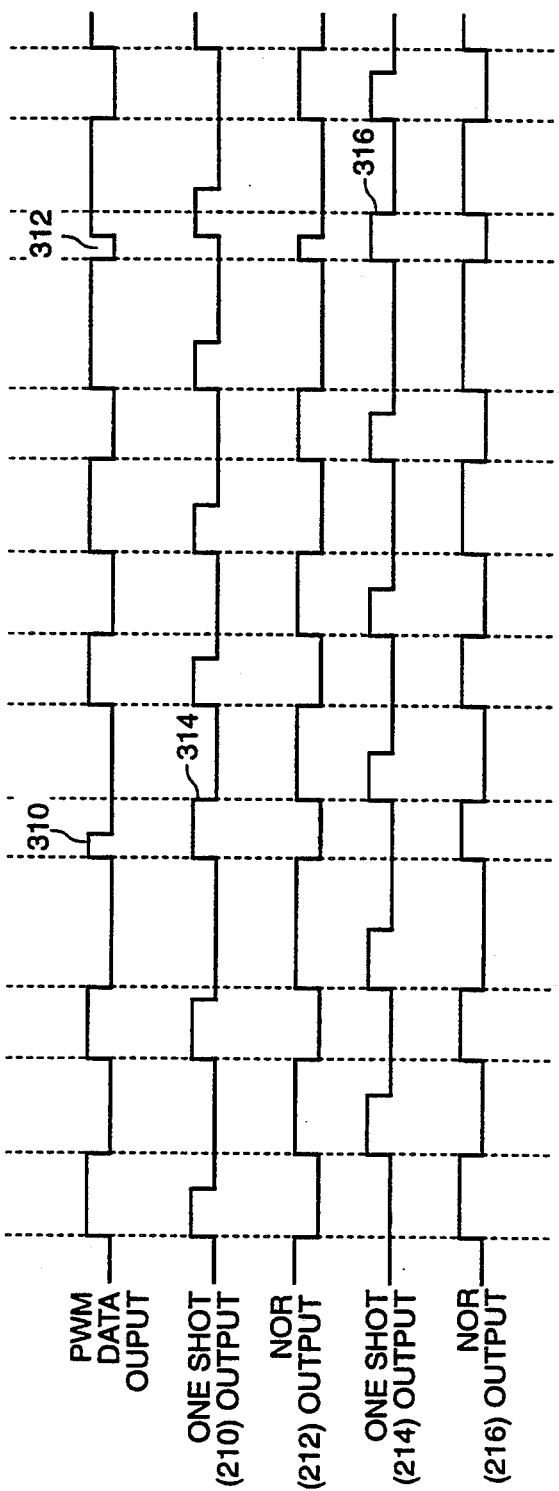

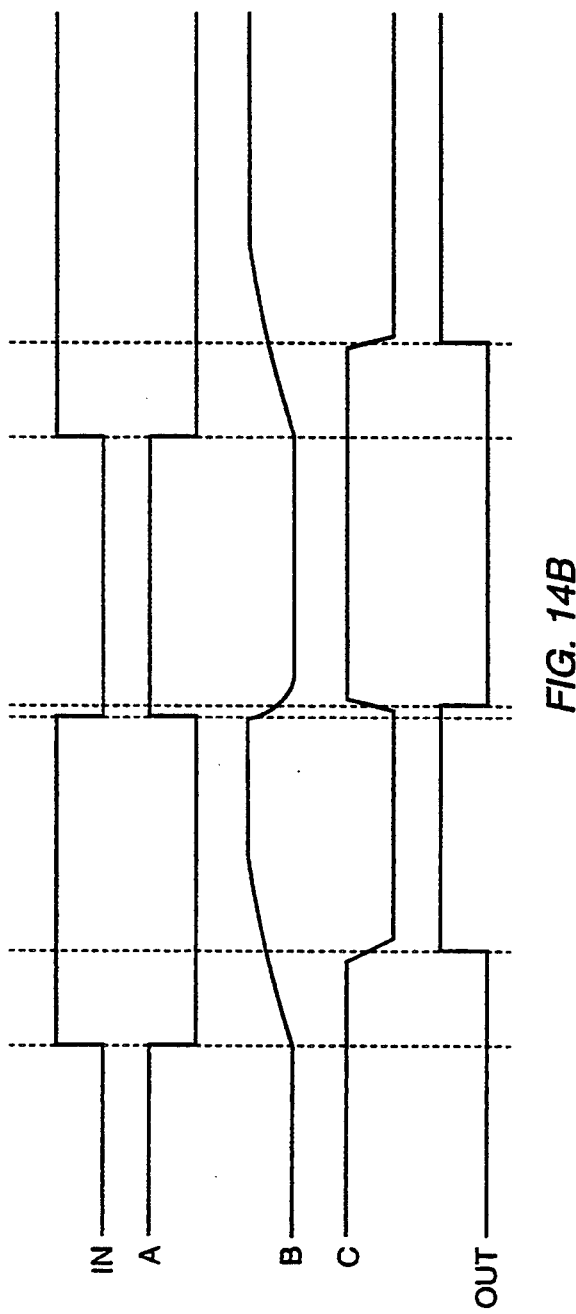

OUTPUT LIMITER FOR CLASS-D BICMOS HEARING AID OUTPUT AMPLIFIER

This application is a continuation-in-part of application Ser. No. 07/765,481, filed Sept. 27, 1991, U.S. Pat. No. 5,247,581, entitled CLASS-D BICMOS HEARING AID OUTPUT AMPLIFIER.

BACKGROUND

The present invention relates to class-D output amplifiers for hearing aids.

With the advances in manufacturing technologies and circuit design techniques, hearing aid devices have been considerably reduced in size and their functionality has been increased. In recent years, hearing aid output amplifiers employing class-D architecture have been successfully designed and fabricated. See U.S. Pat. No. 4,689,819 and F. Callias et al., "A Set of Four IC's in CMOS Technology for a Programmable Hearing Aid", IEEE JSSC, p. 301, April 1989.

Class-D amplifiers combine low power consumption with low harmonic distortion levels without having to go to power/distortion tradeoffs of the conventional class-A and class-B amplifiers. Class-A amplifiers offer low distortion with the expense of a high idle current, while class-B amplifiers offer significantly lower idle current operation but suffer from crossover distortion at low signal levels. However, class-D amplifiers are considerably more complicated than their class-A and class-B counterparts.

The traditional method for limiting the output voltage amplitude for class-B hearing aids has been to insert a variable resistor in series with the output transducer. This method is not suitable for class-D output amplifiers.

For a class-B output amplifier there is no current in the load transducer when there is no audio frequency signal to the amplifier. Therefore a resistor in series with the load will not produce any increase in quiescent power consumption.

For the class-D output there are large current flows in the load transducer at all times, even when there is no audio frequency signal. The class-D output circuit relies on the inductive nature of the load transducer to minimize quiescent power consumption. A resistive limiter in series with the output transducer would dissipate steady state power even with no audio frequency signal, thereby defeating the low power consumption advantage of the class-D. A hard limiter scheme for the class-D is needed.

A class-D amplifier uses an oscillator which generates a high frequency triangular waveform. It is also possible to employ an oscillator with a high frequency square wave output. In the latter case, the triangular waveform required in the modulation process is obtained by integrating the square wave. The input to be amplified is added to the triangular wave and this composite signal is compared to a reference voltage level. This process, commonly known as pulse-width-modulation or as pulse-duration-modulation, gives at the output of the comparator a square wave pulse train with a duty cycle continuously changing in response to the input signal. This signal is then provided to a transducer where it is converted back into an amplitude level which is an amplified replica of the input signal.

An important problem of any hearing aid design is stability. The non-zero value of the battery internal impedance causes the voltage at the battery line to be modulated by the signal current flowing through the transducer. This effect can feed back to the front-end circuit blocks where lower signal levels are processed and can cause instabilities. Systems using class-D output amplifiers are no exception in this matter. The class-D output amplifiers of prior art have used compensation schemes to cancel out the adverse effects of the battery internal impedance on the system stability. These compensation schemes are somewhat successful at high frequencies but the proposed methods are not satisfactory at low frequencies. Besides the stability of the amplifier itself, these output amplifiers required external resistor-capacitor (RC) lowpass filters to filter out the unwanted signals from the supply voltage to the external circuit blocks such as preamplifiers, filters and to the microphone. Such RC filters often require a large value capacitor which increases the overall size of the hearing aid device.

The batteries found in today's hearing aid devices are typically single cell, 1.2–1.6 volt batteries. Although great advances have been made in the battery technology, the limited voltage and current capacity of a single cell still poses a major challenge in the hearing aid design field. A successful hearing aid circuit must be able to operate at low voltages and consume a minimal amount of power. Recently, attempts have been made to take advantage of the low current consumption of the CMOS devices operating in switching mode. This limits what can be done with CMOS circuitry in an analog hearing aid system. However, bipolar circuitry which is intrinsically better suited for low voltage analog applications can be employed to design higher performance hearing aid devices while still keeping the power consumption at an acceptable level.

SUMMARY OF THE INVENTION

The present invention provides a hard limiter between the pulse width modulator and output drive transistors of a class-D amplifier. The limiter functions by controlling the duty cycle of the pulse width modulator output, which directly corresponds to the magnitude of the voltage appearing across the load output transducer. The pulse width modulated (PWM) signal is compared to the outputs of a pair of one-shot circuits (single pulse generators). If either the positive pulse or the negative pulse of the PWM signal is shorter than the one-shot pulse, then the one-shot pulse is substituted for the PWM pulse. This sets the maximum and the minimum values for the duty cycle of the PWM signal, thereby limiting the positive and negative value of the corresponding output voltage.

The control of the pulse width of the one-shot is preferably through a variable resistor. The present invention also provides a separate control circuit to handle the situation when there is the absence of a pulse from the pulse width modulation amplifier during an oscillator period, which may indicate that the signal is maxed out at 100% (or 0%) duty cycle, giving no pulse input and thus not triggering the one-shot. In this situation, the control circuit monitors the pulse width modulator output and will itself generate a default pulse in the event no pulse is detected from the pulse width modulator during an oscillator period.

The present invention is fabricated using a Bipolar and Complementary Metal Oxide Semiconductor (BICMOS) technology which offers both bipolar and CMOS devices on the same silicon substrate. The limiter portion of the circuit uses bipolar devices for the analog functions (such as the comparators and the one-shots) and uses CMOS devices for the digital logic functions. The major part of the rest of the class D amplifier uses bipolar devices except for the output circuit driving the transducers which uses CMOS inverters. A voltage regulator which is fed from the battery lines is used to power the majority of the bipolar circuitry, leaving only the digital logic, the CMOS output drivers and part of the level converters to be powered directly from the battery lines. This architecture guarantees that no signal is fed back to the previous stages of the hearing aid system through the battery lines, ensuring stable operation for an extended range of the battery internal impedance value. The bipolar front-end blocks of the circuit are designed using low-voltage bipolar design techniques to operate at the 1 volt level produced by the internal voltage regulator. The voltage regulator employs a bipolar base-emitter voltage reference, which ensures the tracking of its output voltage with the headroom requirements of the bipolar circuitry over the temperature and process variations.

For a further understanding of the nature and advantages of the invention, reference should be made to the ensuing detailed description taken in conjunction with the accompanying drawings.

BRIEF DESCRIPTION OF THE DRAWINGS

FIG. 14B is a timing diagram for FIG. 14A;

DETAILED DESCRIPTION OF THE PREFERRED EMBODIMENT

The present invention provides a hearing aid output amplifier integrated circuit fabricated in a Bipolar and Complementary Metal Oxide Semiconductor (BIC-MOS) process technology which offers bipolar and CMOS devices on the same silicon substrate.

Figure 1:
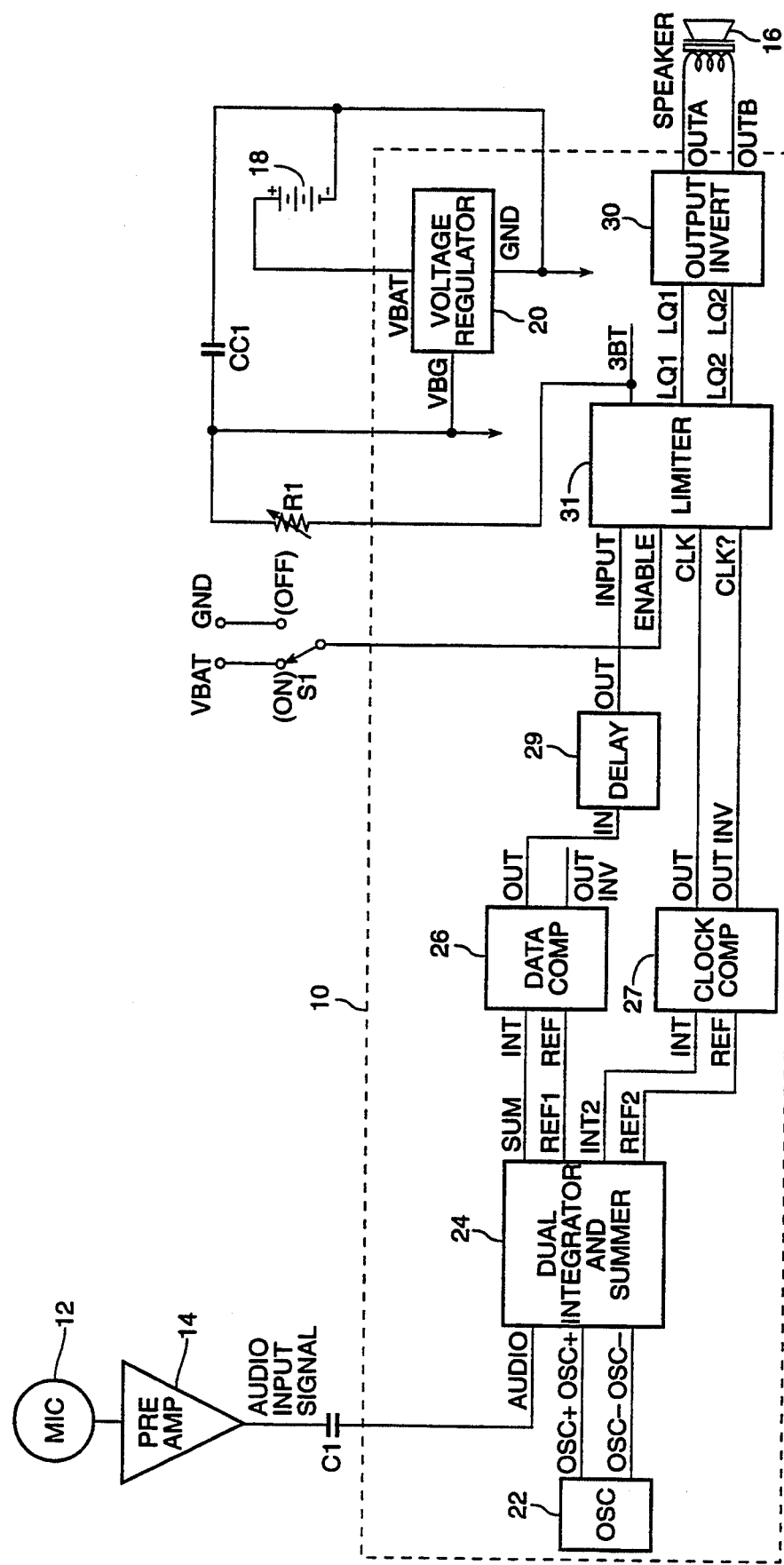
FIG. 1 is a functional block diagram of a preferred embodiment of the present invention.

FIG. 1 is a block diagram of a preferred embodiment of the present invention. The BICMOS output amplifier is shown enclosed within rectangle 10 representing the integrated circuit chip, along with its associated external components required to build a complete hearing aid system. The audio signal is picked up by a microphone 12 and is preamplified by a preamplifier 14. The preamplified audio frequency signal enters the output amplifier 10 at terminal "audio" and, being amplified by output amplifier 10, drives a conventional hearing aid transducer 16 connected between the output terminals.

The system is powered by a 1.15 to 1.60 volt battery 18. An internal voltage regulator 20 draws its power from battery 18 and generates a regulated voltage of approximately 1 volt on the internal power bus VRG which is used as the supply voltage by the major part of the internal analog circuitry.

An oscillator 22 draws its power from bus VRG and generates between its output nodes OSC+ and OSC− an ultrasonic square wave of 50% duty cycle. A summing integrator and reference generator 24, also drawing its power from bus VRG, integrates the waveform at its input and produces a triangular waveform at its output node SUM. At the same time, it generates a reference voltage at its reference output REF1 of a value precisely equal to the average value of the waveform at node SUM which will be used as a threshold voltage by a comparator 26.

The audio signal enters the system at terminal "audio", capacitively coupled to the output of the preamplifier 14 and is summed up with the triangular waveform at node SUM using a predefined weighting ratio as will be focused on later in the description. Thus, a waveform composed of the audio signal and of the ultrasonic triangular waveform produced by the integration process is present at node SUM. In the absence of an audio frequency signal at terminal "audio", the excursions of the signal at node SUM above and below the reference voltage at node REF1 are of equal duration. Any audio signal input shifts the ultrasonic triangular waveform around the reference voltage, changing the duration of the time intervals between "axis crossings". The term "axis crossing" will be used throughout the description of the invention to denote the moment of excursion of the composite signal at node SUM through the reference voltage value at node REF1.

Comparator 26, also drawing its power from VRG, compares the composite waveform at its input node SUM with the threshold voltage at its other input REF1 and switches its output at the axis crossings of the input. The output waveform is an ultrasonic square wave with a duty cycle changing in response to the shifts in the axis crossings caused by the audio signal at input terminal "audio". A larger amplitude audio signal causes more change in the duty cycle since it causes a larger shift in the axis crossings. Thus, a pulse width modulation process is achieved by adjusting the widths of the ultrasonic pulses derived from the oscillator, in response to the audio signal amplitude. The pulse-width-modulated (PWM) signal from the comparator is fed into a level converter (inside the comparator block) which converts the low level swings to rail-to-rail swings required to drive the CMOS input of the delay circuit 29. The delay 29 and the limiter 31 are described below. After the limiter the PWM signal goes to the CMOS output driver 30. The output driver consists of two identical tapered chains of three inverters, with the last inverters in the chain large enough to drive the electroacoustical transducer 16.

Limiter

Figure 2:
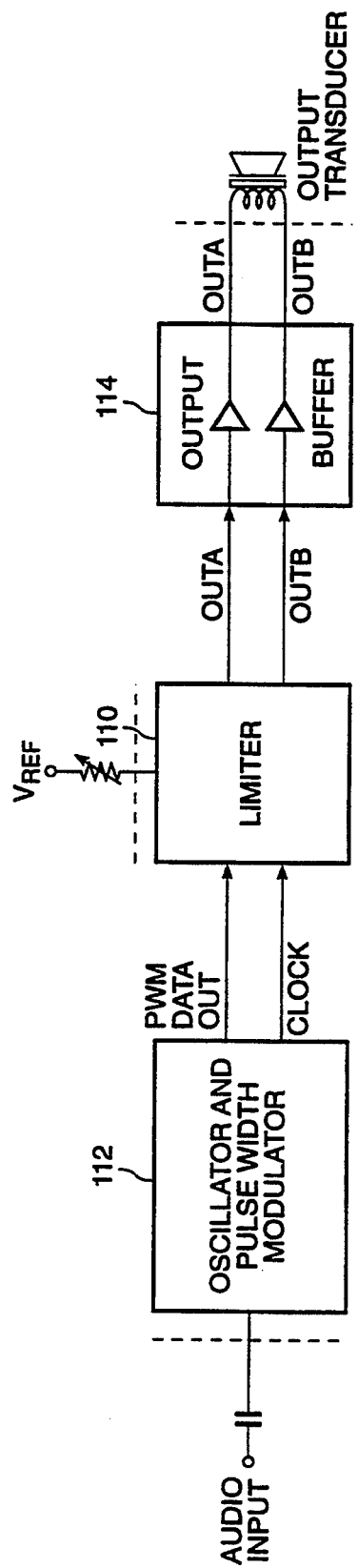
FIG. 2 is a diagram of a system using a limiter according to the present invention.

The invention provides a hard limiter function designed to be inserted into a class-D power amp for hearing aids. A limiter 110 is placed between the output of the pulse-width-modulator (PWM) 112, and the inputs of the power drive transistors 114, as shown in FIG. 2. The PWM block is changed to generate a clock output along with the pulse width modulated data output.

In a class-D amplifier there is a direct correspondence between the duty cycle of the PWM output, and the resulting signal voltage appearing across the load. That relationship is described by the equation:

$$Vout = (Vbat - Vswitch) * \left( \frac{50\% - D/C}{50\%} \right)$$

Where Vout is the signal voltage across the load; Vbat is the battery voltage; Vswitch is the total voltage drop across the output driver switches; D/C is the duty cycle of the pulses applied to the load. A system that limits the magnitude of the quantity (50%-D/C) will limit the magnitude of the signal voltage at the load.

Figure 3A:
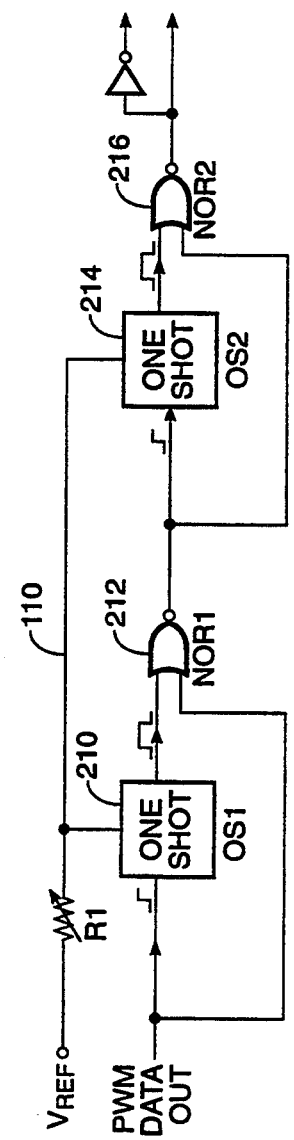
FIG. 3 is a block diagram of the limiter of FIG. 2.

A simplified block diagram in FIG. 3a illustrates the basic concept of limiter 110 of the invention. The limiter input is the output of the PWM circuit. The duty cycle of the input pulses can range from 0% (input always low; no positive pulses) to 50% (equal positive and negative pulse widths) to 100% (input always high; no negative pulses.) At the beginning of every positive pulse, the one-shot 210 fires, producing an output pulse with a length determined by the setting of resistor R1. The output of one-shot 210 is combined with the input PWM data signal in NOR gate 212. If the length of the input pulse is longer than the one-shot pulse, then the positive pulse at the output of NOR gate 212 is the same as the input pulse. If the length of the input pulse is shorter than the one-shot pulse, then the positive pulse at the output of NOR gate 212 is the same as the one-shot pulse. The result is that the minimum duty cycle at the output of NOR gate 212 is now limited to: (OSP/T)*100%, where OSP is the length of the one-shot output pulse; T is the period of the PWM oscillator. One-shot 214 and NOR gate 216 perform the same function for negative input pulses that one-shot 210 and NOR gate 212 perform for positive pulses. Thus as long as the periods of the output pulses for the two one-shots are equal, the limiting is symmetrical, with positive and negative outputs both clipping at the same magnitude. The timing diagram in FIG. 3b illustrates this function. The short positive 310 and negative 312 pulses are replaced by the one-shot pulses 314 and 316 respectively in the output waveform. No positive or negative pulses shorter than the one-shot pulses ever occur in the output waveform.

The circuit as illustrated in FIG. 3 works properly when the audio input signal level is low enough that the output would not clip without a limiter circuit. When the input signal is large enough to cause the output to clip without a limiter, then there is a "stairstep" pattern in the output. This is illustrated in FIG. 4.

Figure 4:
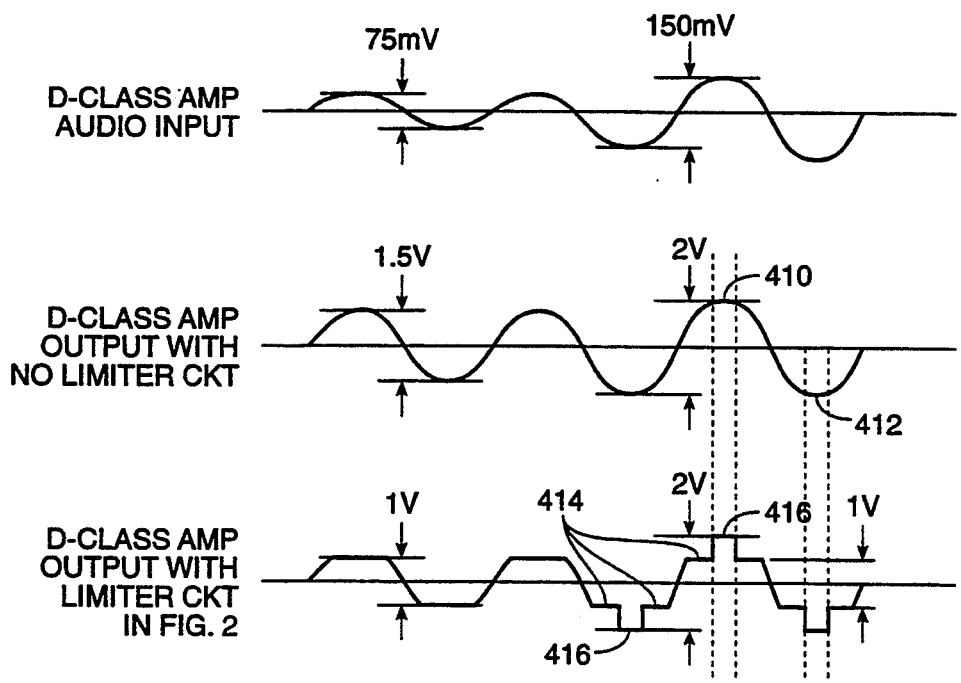
FIG. 4 is a timing diagram illustrating the effect of limiting on the pulse waveform.

FIG. 4 first shows the class-D audio input, and then the output without a limiter circuit. As can be seen, a clipping effect occurs at peak and valley 410 and 412 due to the limited output range of the circuitry. The waveform immediately below shows the effect with the one-shot limiter circuitry of FIG. 3. The limiter function kicks in at points 414. At peaks and valleys 416, the PWM hits 0% or 100% modulation, and there are no longer any pulses generated to trigger the one-shots. Accordingly, the limiting effect is no longer present, with the amplitude shooting up to the natural limitation range of the circuitry at points 416. Thus, two different maximum amplitude levels will be obtained for an input signal which is desired to have the same output level. If the one-shots are not triggered the output reverts to a 0% duty cycle (always low) or 100% duty cycle (always high) case.

Figure 5:
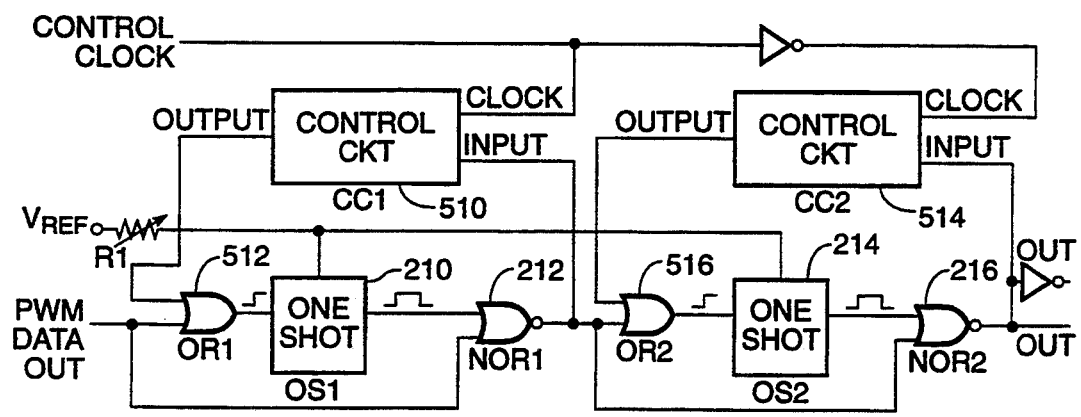
FIG. 5 is a diagram of an alternate embodiment of a limiter adding a control circuit for generating default pulses.
Figure 6:
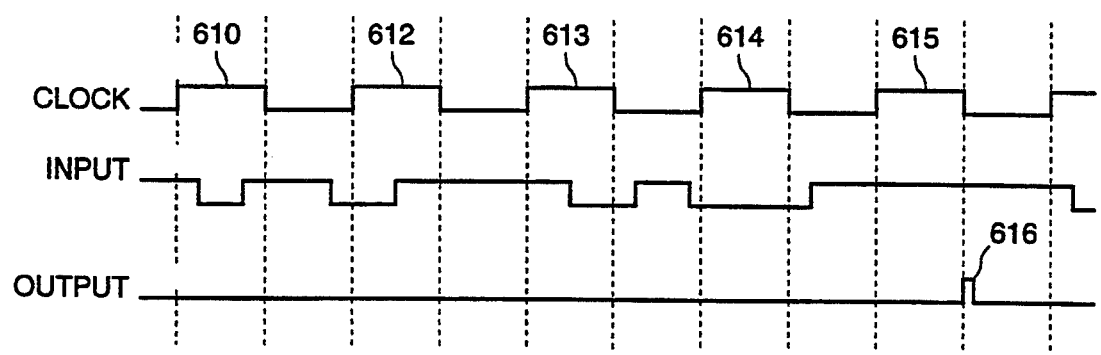
FIGS. 6 and 7 are timing diagrams illustrating the position of the pulses in the system of FIG. 5.

The circuit shown in FIG. 5 was developed to solve this problem. The control circuit block 510 is designed to send a trigger pulse to one-shot 210, through gate 212, when the output of NOR gate 212 does not go low any time during a clock pulse. FIG. 6 shows the required relationship between the control circuit 510 INPUT and CLOCK, and the control circuit OUTPUT. Control circuit 514 and OR gate 516 perform the same function for the opposite polarity pulses.

As can be seen in FIG. 6, there is an input pulse during each of clock cycles 610, 612, 613 and 614. As can be seen, there is no pulse on the input during clock cycle 615. Control circuit 510 will deliver a pulse to trigger one-shot 210 any time that PWM data out does not go high during some portion of the positive clock pulse. Complementing this for the opposite polarity case, control circuit 514 will deliver a pulse to trigger one-shot 214 any time that PWM data out does not go low during some portion of the negative clock pulse.

Figure 7:
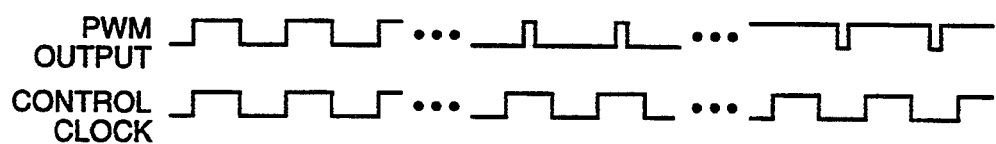

FIG. 7 shows the preferred relationship between the CONTROL CLOCK signal and the pulse width modulated PWM OUTPUT signal. Short positive PWM OUTPUT pulses should occur near the center of the positive CONTROL CLOCK pulses and short negative PWM OUTPUT pulses should occur near the center of the negative CONTROL CLOCK pulses. The relationship between the data and clock pulses is required because of the way the control circuit functions. If the data pulses occur near the ends of the clock pulses, it is possible when the data pulses are very short that jitter in either the data or the clock signals may cause the data pulses to occur completely outside the clock pulses. This will result in an extra pulse being set to the one-shot in addition to the data pulse itself. If it were not for this constraint the limiter clock could be taken directly from the oscillator, which would save having to build a second integrator and comparator.

Figure 8A:
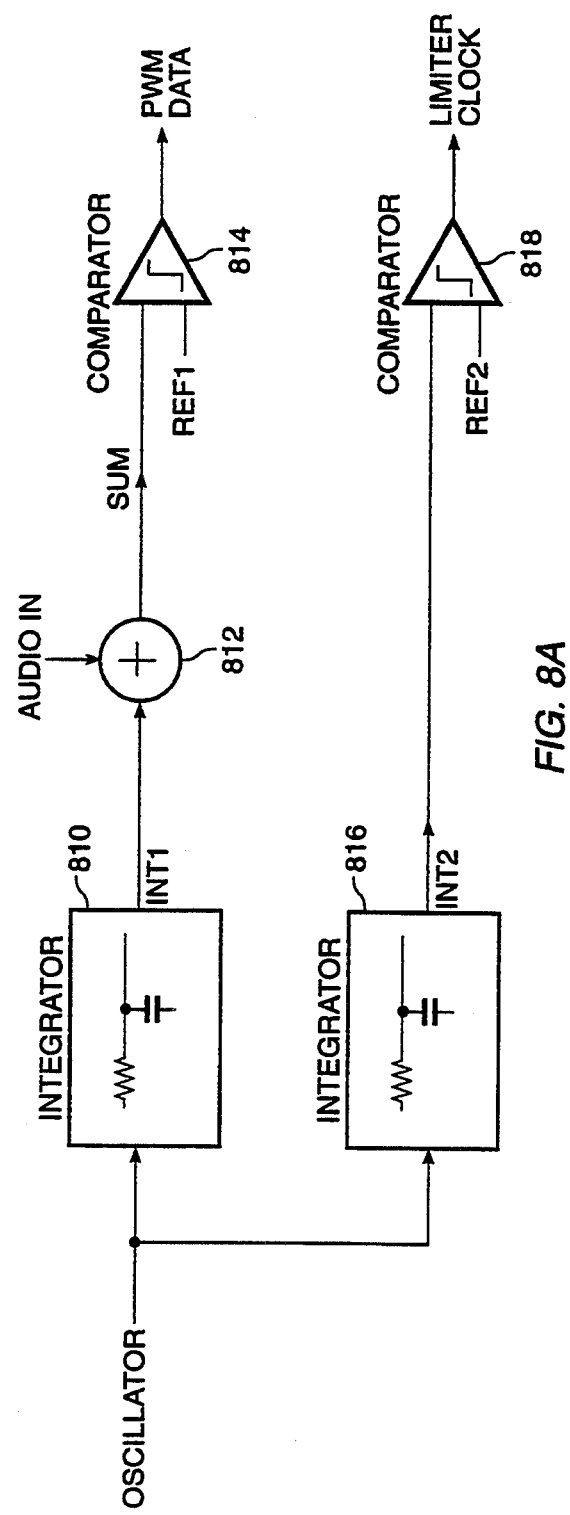
FIGS. 8A-8B are diagrams of alternate embodiments of generating a limiter clock.
Figure 8B:
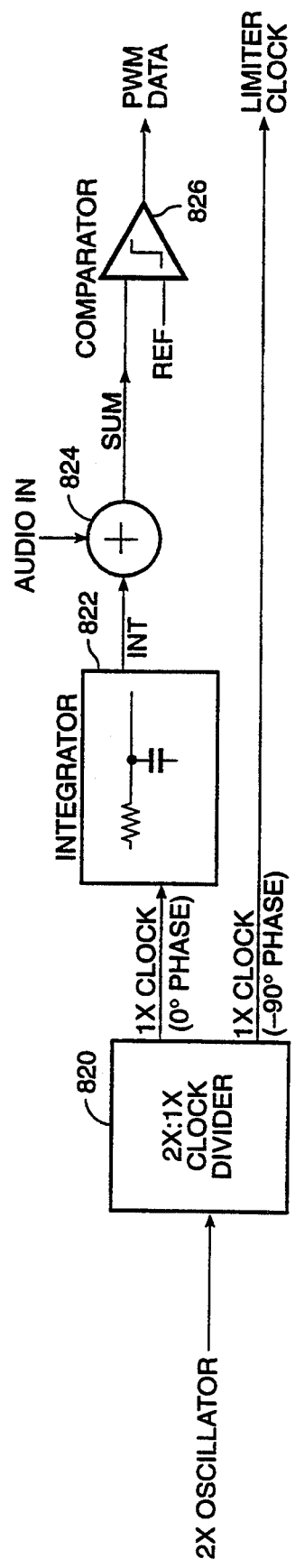
Figure 8C:
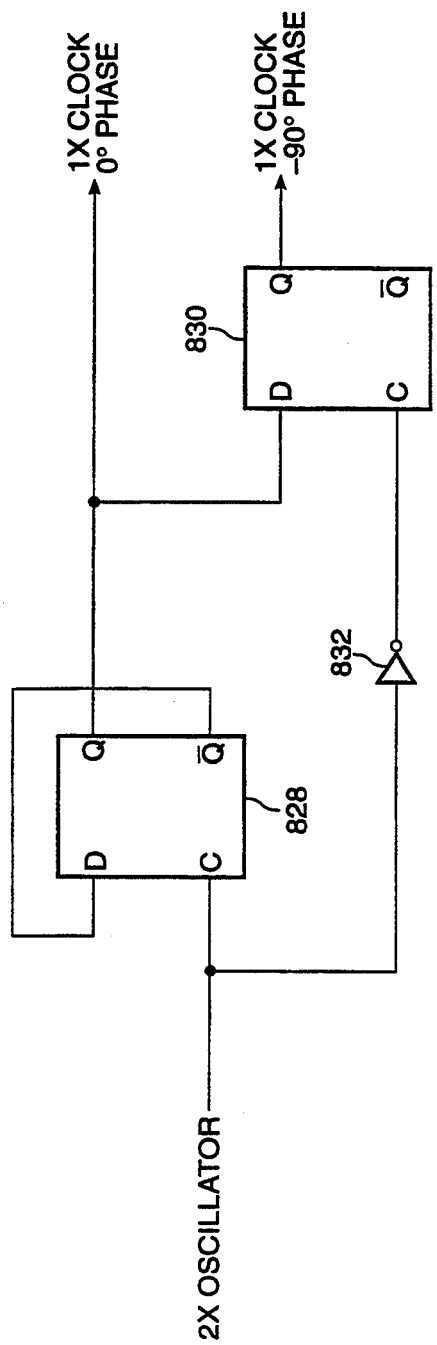

FIGS. 8A–8C show two ways to generate the necessary relationship between clock and data as described above.

Figure 9A:
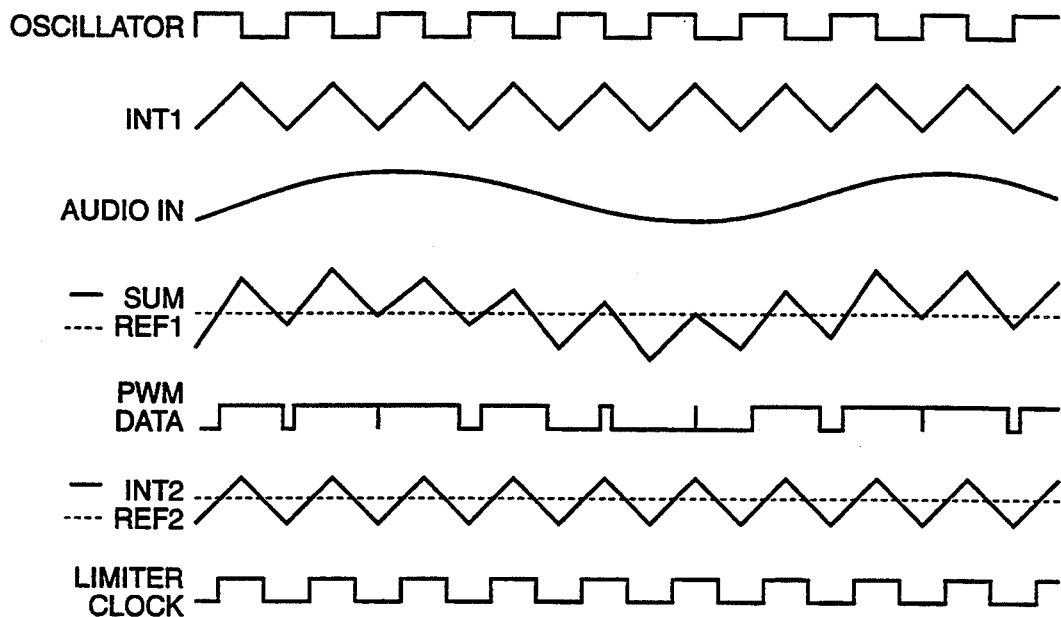
FIGS. 9A and 9B are timing diagrams for the circuits of FIGS. 8A and 8B.

FIG. 8A shows an integrator 810, a summer 812, and a comparator 814 to generate the PWM DATA, and uses a second integrator 816 and comparator 818 to generate a LIMITER CLOCK which is in phase with the PWM DATA. FIG. 9A shows representative waveforms for this circuit.

Figure 9B:
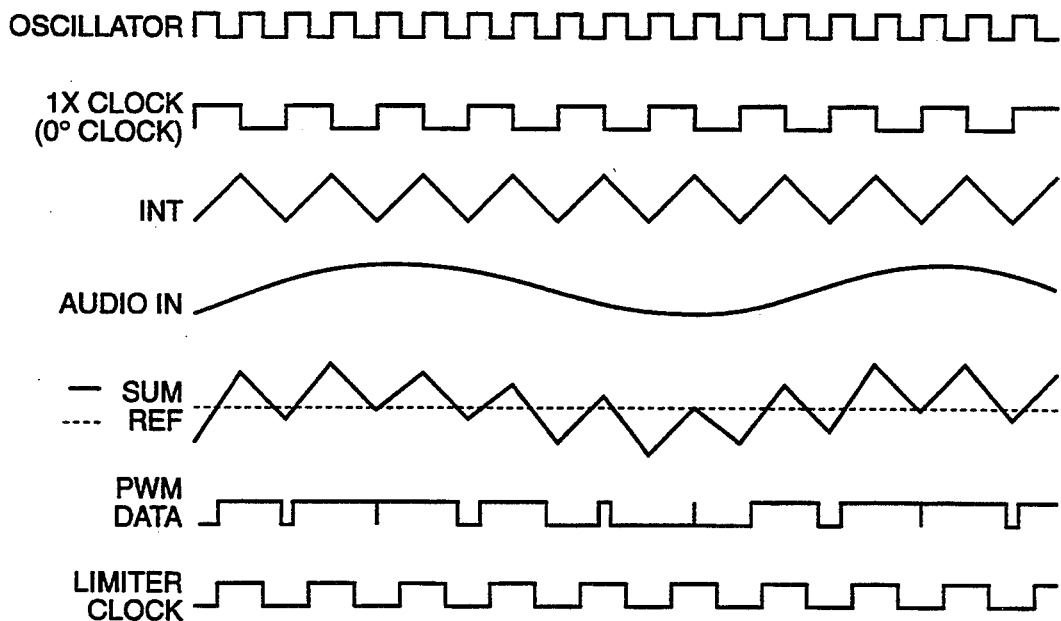

FIG. 8B shows a method suitable to systems which use a 2× oscillator frequency, divided in half to get a 1× clock with accurate 50% duty cycle. Such a system was described in U.S. Pat. No. 4,689,819 by Killion. The method uses a 2× to 1× clock divider 820 which has two outputs, one with 0° phase shift and one with −90° phase shift. This built-in −90° phase shift compensates for the −90° phase shift of the integrator 822 in the path which generates the PWM DATA through summer 824 and comparator 826. As a result the LIMITER CLOCK and the PWM DATA are in phase with each other, the same as for the method in FIG. 8A. FIG. 9B shows representative waveforms for the circuit in FIG. 8B. FIG. 8C shows a method to create two clocks, one with −90° phase relationship to the other, using only 2 flip-flops 828, 830 and one inverter 832.

Figure 10:
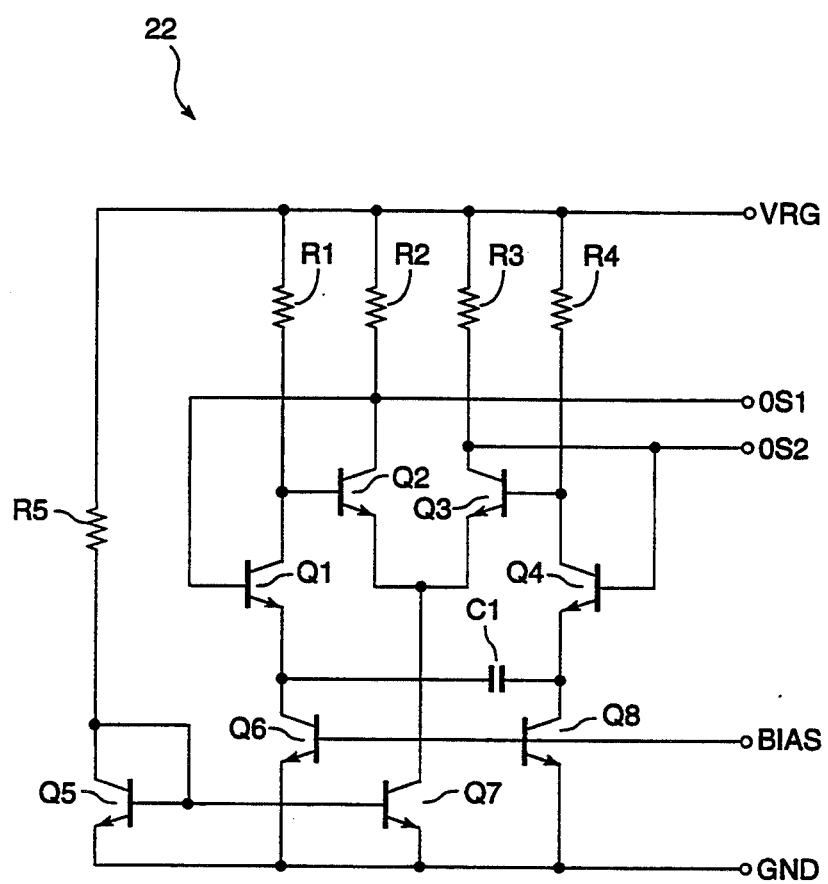
FIG. 10 is a schematic drawing of the oscillator circuit of FIG. 1.

Following is a detailed description of the circuit blocks forming the output amplifier. The schematic diagram of oscillator 22 of FIG. 1 is given in FIG. 10. The oscillator is of the emitter coupled type. Bipolar transistors Q2 and Q3 along with their collector load resistors R2 and R3 form a differential amplifier biased by current source transistor Q7. The positive feedback arrangement built around the differential amplifier with Q1, Q4, R1 and R4 ensures that the circuit oscillates at a frequency defined by the voltage swings across R2 and R3, the value of the on-chip capacitor C1 and the discharge currents provided by the current source transistors Q6 and QS. The bias voltage required at the bases of Q6 and Q8 is supplied to this block via bias node BIAS, as will be discussed later in connection with FIG. 11.

Totally symmetrical operation is achieved by making each element in one half-circuit as an identical twin of its counterpart in the other half-circuit. Thus, a symmetrical ultrasonic waveform is obtained between the oscillator output nodes OS1 and OS2. Q5, connected as a diode, along with bias resistor R5, produces a bias voltage at the base of Q7 which defines its collector current. Since the voltage drop across R2 (or R3) is one of the factors governing the oscillation frequency, it is possible to change the frequency by adjusting R5. Thus, it is possible to run the circuit at a frequency best suited for a particular type of transducer used at the output, making it possible to minimize high frequency losses of the output switching. Experimenting with various types of transducers has shown that the best results in terms of idle current are obtained with oscillator frequencies ranging from 50 Khz to 200 Khz, depending on the particular type of transducer connected to the output terminals. The value of R5 can be adjusted by one of various methods such as metal mask option, zener zapping to short out the unwanted portion of R5 or employing multiple pads connected to tapping points on R5.

Figure 11:
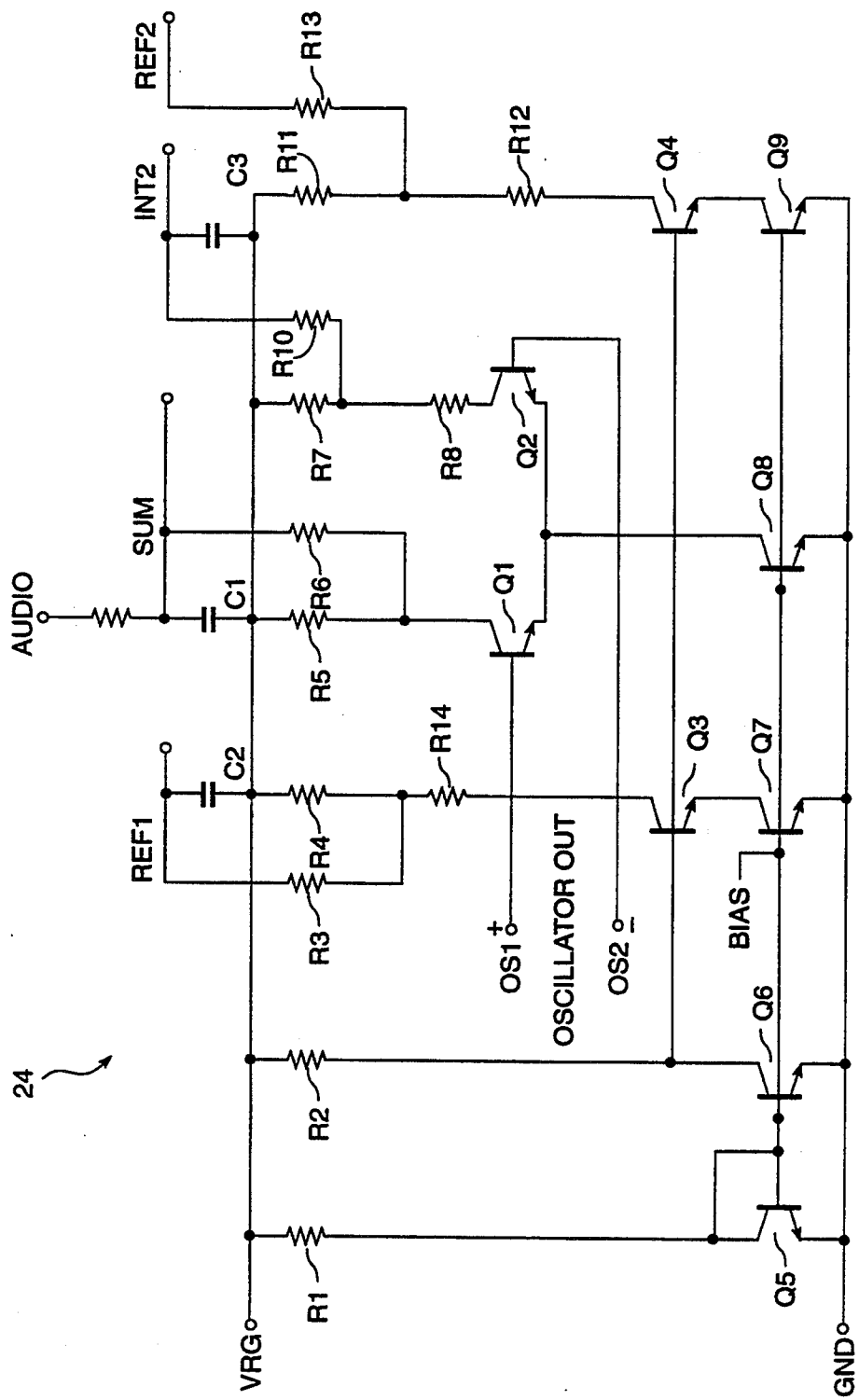
FIG. 11 is a schematic drawing of the summing integrator and reference generator circuit of FIG. 1.

The detailed schematic diagram of the summing integrator and reference generator 24 of FIG. 1 is shown in FIG. 11. Transistors Q1 and Q2 along with resistors R5, R7 and R8 form a differential amplifier biased by current source transistor QS. The output signal of the oscillator, which is not a perfect square wave mainly due to the limited loop gain in that circuit block, gets amplified by the differential amplifier to approximate a square wave. R6, R9 and C1 form the summing integrator. This simple circuitry performs the integration of the ultrasonic square wave and the weighted addition of the audio signal to the triangular waveform produced in the integration process. The weighting ratio of the waveforms entering the summing integrator is defined by the relative values of the integration resistors R6 and R9, provided that R5 and the audio source impedance are negligible with respect to R6 and R9. The value of the integration capacitor C1 is chosen so that a triangular wave of reasonable linearity is produced at an output SUM by the simple integration of the ultrasonic square wave.

Transistor Q3, resistors R3, R4, R14, R2, capacitor C2 and current source transistors Q6, Q7 form a reference generator circuit, producing a voltage level at output REF1, precisely equal to the average value of the waveform at integration output SUM, independent of the process variations. The values of R3 and of C2 are selected so that the impedance looking into output REF1 is essentially the same as the one looking into output SUM. This architecture of the block assures that the same instantaneous voltages and the same impedances are presented by the two outputs to the subsequent block at axis crossings. C2's inclusion also guarantees that any high frequency noise signal which may be present on the VRG bus will appear at the REF1 output as well as at the SUM output (the appearance of the noise signal at SUM is mainly due to the integration capacitor C1). Thus, as long as the following circuit block has differential inputs with a reasonable common mode rejection, the noise signals on SUM and REF1 will not create a problem since the differential noise voltage between the two named outputs will be nearly zero. The bias voltage to the bases of the current source transistors of this stage are supplied via node BIAS.

A similar circuit is provided for REF2, to track output INT2. Q2, Q8, R7, R10 and C3 generate a second triangle which is input to the clock comparator 27 of FIG. 1 via node INT2. Q4, Q9, R11, R12, and R13 produce a voltage level at node REF2 which is precisely equal to the average value of the waveform at the node INT2.

The reference voltages and triangle waves are fed into comparators which convert the triangle wave signals into pulses. The duty cycle of the DATA COMPARATOR output pulse is proportional to the AUDIO input voltage. The duty cycle of the CLOCK COMPARATOR output pulse is fixed at 50%.

Figure 12:
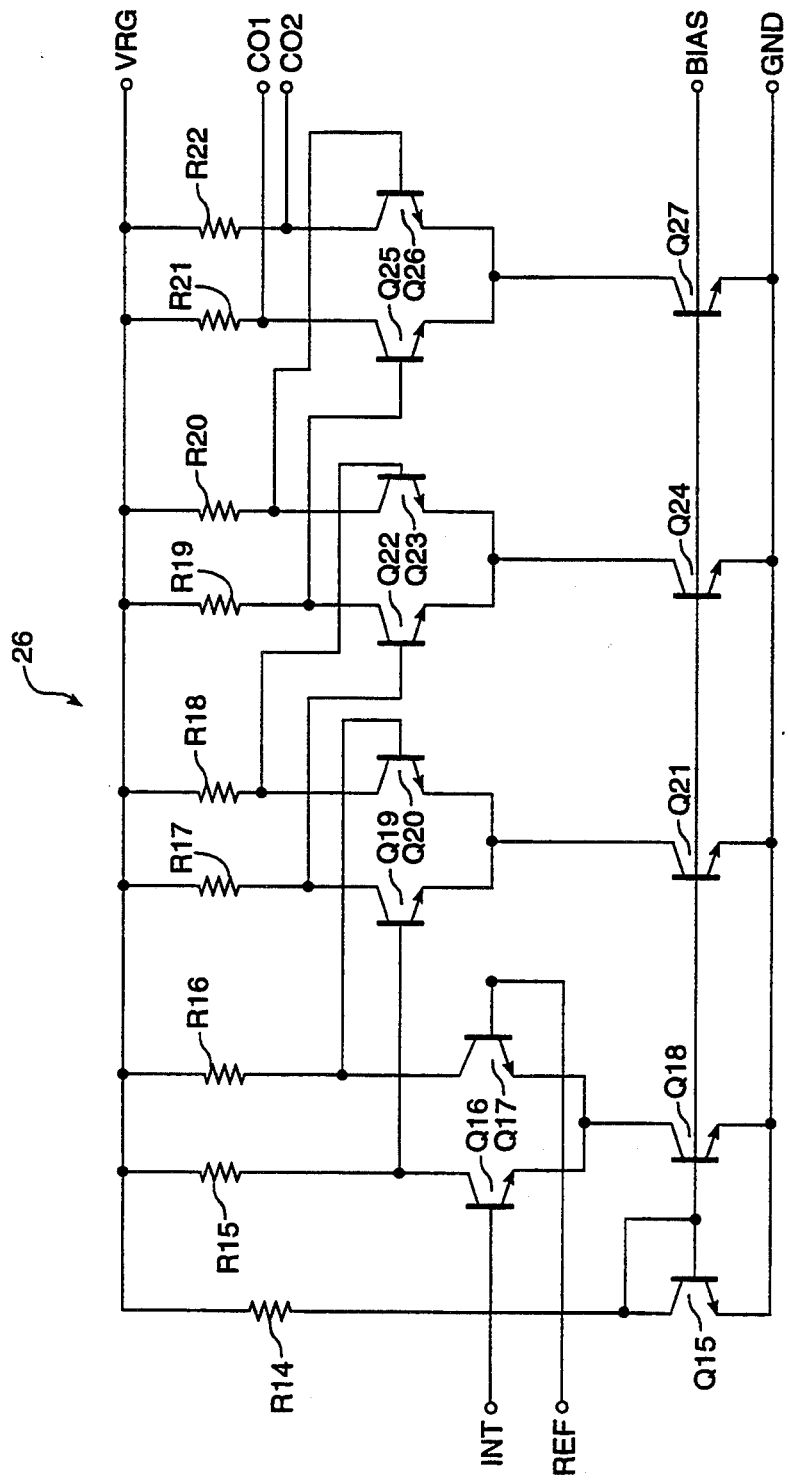
FIG. 12 is a schematic drawing of the comparator circuit of FIG. 1.
Figure 13:
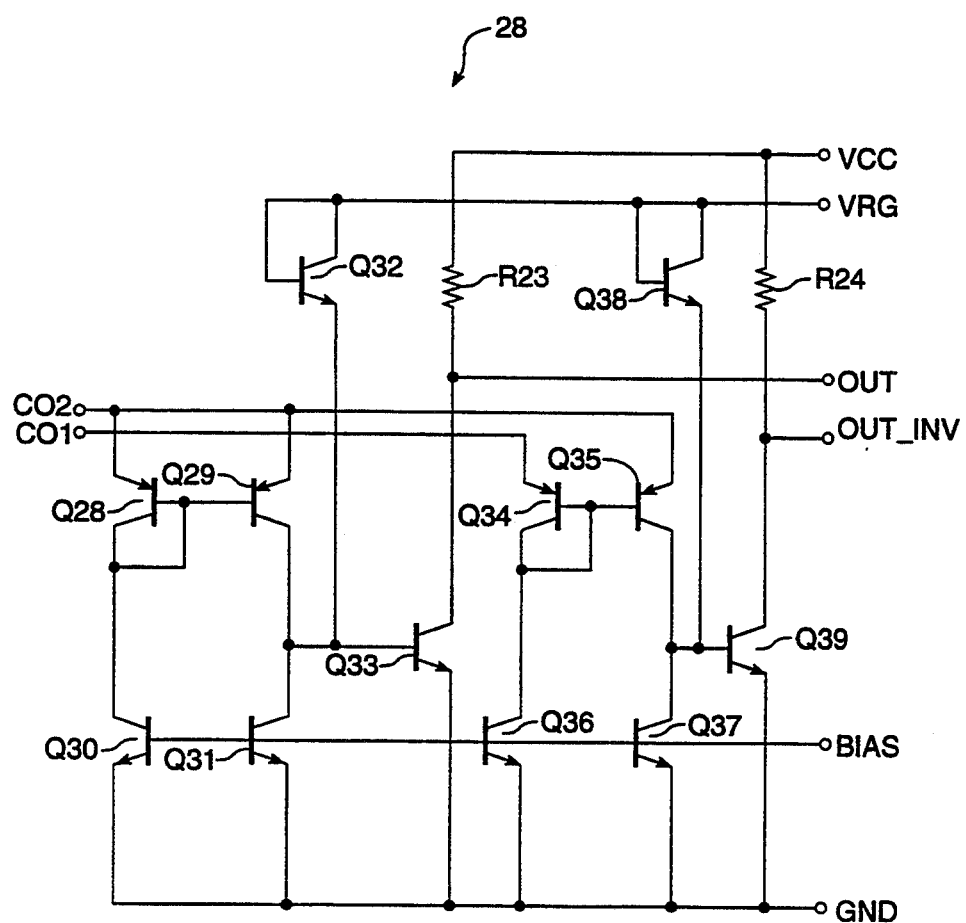
FIG. 13 is a schematic drawing of the level converter circuit of the comparator of FIG. 1.

FIGS. 12 and 13 are a schematic diagram of one of the comparator blocks 26 and 27 of FIG. 1. FIG. 12 shows the main comparator stage, while FIG. 13 shows the level converter output of the comparator. The comparator consists of four cascaded differential stages. The architecture is designed so that a reasonable gain and input offset is obtained while operating at low current levels and low voltages. Q16 and Q17, along with their respective load resistors R15 and R16 form the differential input stage biased by current source transistor Q18. The second stage is formed by Q19, Q20, R17, R18 and Q21. Similarly, the third and the fourth stages are comprising of Q22, Q23, R19, R20, Q24 and Q25, Q26, R21, R22, Q27, respectively. The bias voltage of the current source transistors is set by diode connected Q15 and by resistor R14. This bias voltage is also made available to other circuit blocks via the BIAS node. For the data comparator 26 the differential inputs INT and REF are connected to the SUM and REF1 outputs of the integrator and reference generator block. For the clock comparator 27 the differential inputs INT and REF are connected to the INT2 and REF2 outputs of the integrator and reference generator block.

The comparator outputs CO1 and CO2 change states whenever an axis crossing occurs at the input. With no audio signal component present at the INT output of the integrator, the axis crossings occur with equal time intervals at the rising and falling edges of the ultrasonic triangular wave at node INT of FIG. 1. This condition is referred to as "idling" and causes the comparator to produce at its outputs CO1 and CO2 a square wave of 50% duty cycle. Since the same instantaneous voltages and the same impedances are presented to INT and REF inputs at the axis crossings, the idling duty cycle is guaranteed to be 50% with no dependence on process variations and with no need of trimming of any component. Any deviation from the 50% idling duty cycle is caused by the component mismatches which are kept at a minimum by careful planning of the component placement and geometries during the layout design phase of the integrated circuit. The prototype circuits consistently give idling duty cycles with less than 2% deviation from the ideal value of 50%.

Going back to FIG. 1, an audio signal entering the integrated circuit at terminal "audio" causes the triangular waveform at node INT to shift around the reference voltage at node REF as the result of the summing operation performed by the summing integrator 24. Thus the time intervals between the axis crossings change in response to the audio signal amplitude. The comparator 26, switching at the axis crossings, produces at its output nodes CO1 and CO2 opposite phase square wave signals with duty cycles following the audio signal amplitude. Thus, a pulse width modulation is achieved where the audio signal amplitude changes are converted to changes in the duty cycles of the square waves at nodes CO1 and CO2.

As well known in the art, such a pulse width modulated signal is composed of low frequency components of the modulating signal and high frequency components of the modulated signal. The original audio information can be restored from the pulse width modulated signal by a simple low pass filtering process (which will be done by the human ear, since it cannot hear anything above 18–20 Khz. As a matter of fact, the transducer won't be able to reproduce the ultrasonic frequency either.).

The level converter of the comparator is schematically illustrated in FIG. 13. It consists of two identical halves and converts the differential square wave at the comparator outputs to full swing square waves at its outputs LO1 and LO2. To explain the operation of FIG. 13, first consider one half-circuit consisting of Q28, Q29, Q32, Q33, R23 and the current source transistors Q30 and Q31 and suppose the voltage level at input CO1 is higher than the one at input CO2. In this case, diode connected Q28 is carrying the collector current of current source Q30. However, Q29 can carry a lesser current since its base-emitter voltage is less than the one of Q28. Thus the extra current demand of the current source transistor Q31 pulls the base of switch transistor Q33 to a low voltage value, causing the latter to turn off. Since no current is flowing through R23, the output voltage at LO1 is equal to the voltage of the VCC bus. Q32 assures that Q31 never goes into saturation which would otherwise disturb the operation of the current source transistors biased from the same BIAS node.

When the voltage level of CO1 goes below CO2, the base-emitter voltage of Q29 is larger than the one of Q28 and as a consequence Q29 demands a larger collector current than current source Q31 can supply. This condition causes the voltage at the base of Q33 to rise and Q33 to go into saturation, pulling the LO1 output towards the GND bus. The output low level is defined by the saturation voltage of Q33 which is less than 100 millivolts. The same principle of operation applies to the other half-circuit of Q34, Q35, Q38, Q39, R24 and current source transistors Q36 and Q37 with the reversal of the inputs and the substitution of component and output node names. In order to be able to drive the CMOS output driver adequately, the output load resistors R23 and R24 are connected to the VCC bus.

The comparator input is a unique, symmetrical, differential input which receives the signal from the integrator on one line and a reference voltage on the other line. This differential input allows the setting of the comparison point at the desired level by properly controlling the reference voltage. The integrator signal is compared to the reference voltage which, according to another feature of the invention, is precisely equal to the average value of the ultrasonic signal with zero audio input. Thus, with no audio signal input, the triangular waveform's excursions above and below the reference level are of the same duration, resulting in a 0% duty cycle square wave signal at the output of the comparator. As known to those knowledgeable in the art, in a class-D modulator system the duty cycle of the pulses at the output of the comparator depends on the amplitude of the input modulating signal, the audio signal in this case. The audio information of the input is conveyed by the duty cycle at the output of the modulator, provided that the frequency of the modulated signal, the ultrasonic waveform in this case, is at least twice the highest frequency component of the modulating signal. If this condition is met, the original audio signal can be reconstructed from the duty cycle information by a simple filtering operation.

The necessary filtering operation is done by the human ear, which extracts the frequency components within its hearing range and neglects the ultrasonic ones. The conventional transducers used in the hearing aid devices show inductive behavior at high frequencies. CMOS devices used at the output take advantage of this property of the transducers by allowing the high frequency carrier energy to be returned to the battery. A considerable portion of the carrier energy stored in the magnetic field of the inductor during one-half period is transferred back to the battery in the following half period, through the CMOS output transistors. In this process, a tolerable amount of high frequency energy is lost due to the leakage capacitance between transducer windings, to the battery internal resistance and to the non-zero ON resistances of the CMOS output transistor. By the same principle, the current consumption of the circuit can be further lowered by inserting a miniature inductor in series with the transducer. The present invention also provides a resistance in the oscillator block which can be adjusted to optimize the idling current level with different types of transducers.

Figure 14A:
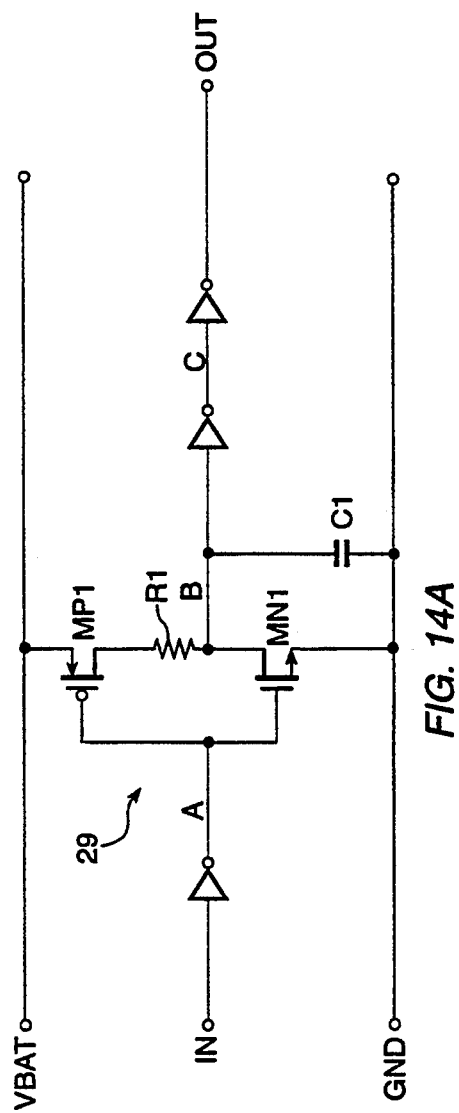
FIG. 14A is a circuit diagram of the delay circuit 29 of FIG. 1.

The DATA COMPARATOR output tend to be slightly over 50% duty cycle with no audio input. The delay circuit 29 shown in FIG. 14A is used to delay the rising edge of the data by about 200 nS to adjust the duty cycle back to 50%. This delay circuit is not essential to the limiter system. It is used here only to improve the performance of this particular application. FIG. 14B shows the waveforms through delay circuit 29.

The output of the delay circuit is input to the limiter circuit. The limiter is shown in detail in FIG. 15. G1 and G11 are the same as the OR gates 512 and 516, respectively, of FIG. 5. The one-shot 210 function of FIG. 5 is performed by flip-flop G2 and variable delay VDEL1. G20 and VDEL2 replace one-shot 214 of FIG. 5. G10 and G21 are the same as the NOR gates 212 and 216, respectively, of FIG. 5. Gates G3, G4, G5, G6, G7, G8, G9, G14 and G15 perform the control circuit function of CC1 in FIG. 5. The purpose of G14 and G15 is to square up the output of the clock comparator. Flip-flop G7 is set with every rising edge of CLK. If no positive INPUT level occurs during the CLK pulse, then the output of G7 will still be high at the falling edge of CLK, and G3, G4, and G5 will produce a positive output pulse which will trigger the one-shot as desired. If a positive level occurs at INPUT any time during the CLK pulse, then through G10, G9 and G8 the reset pin to G7 will be set low, and the output Q of G7 will go low and G3, G4 and G5 will not produce any pulse at the falling edge of CLK. Gates G12, G13, G16, G17, G18, G19, G22, G23 and G24 perform the same function for negative INPUT pulses. NAND gate G26 and G27 are used to gate the inputs to the output drivers. If the ENABLE input goes low, both output drivers go low, and no signal and no power is dissipated into the load. This is useful in systems which have a soft power down mode, where the chip is in a low power consumption mode standing by for a power up command.

Figure 15:
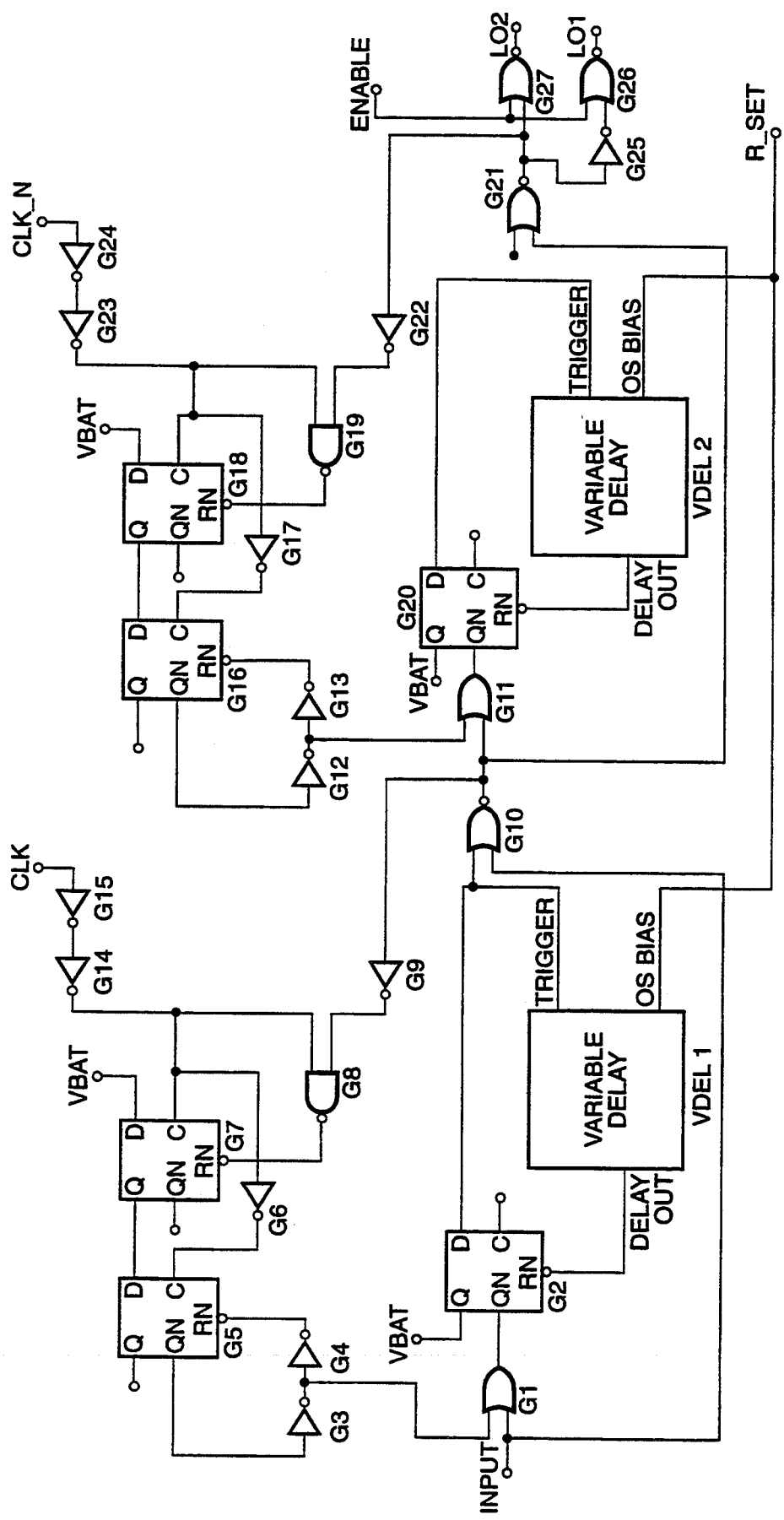
FIG. 15 is a block diagram of limiter 31 of FIG. 1.
Figure 16:
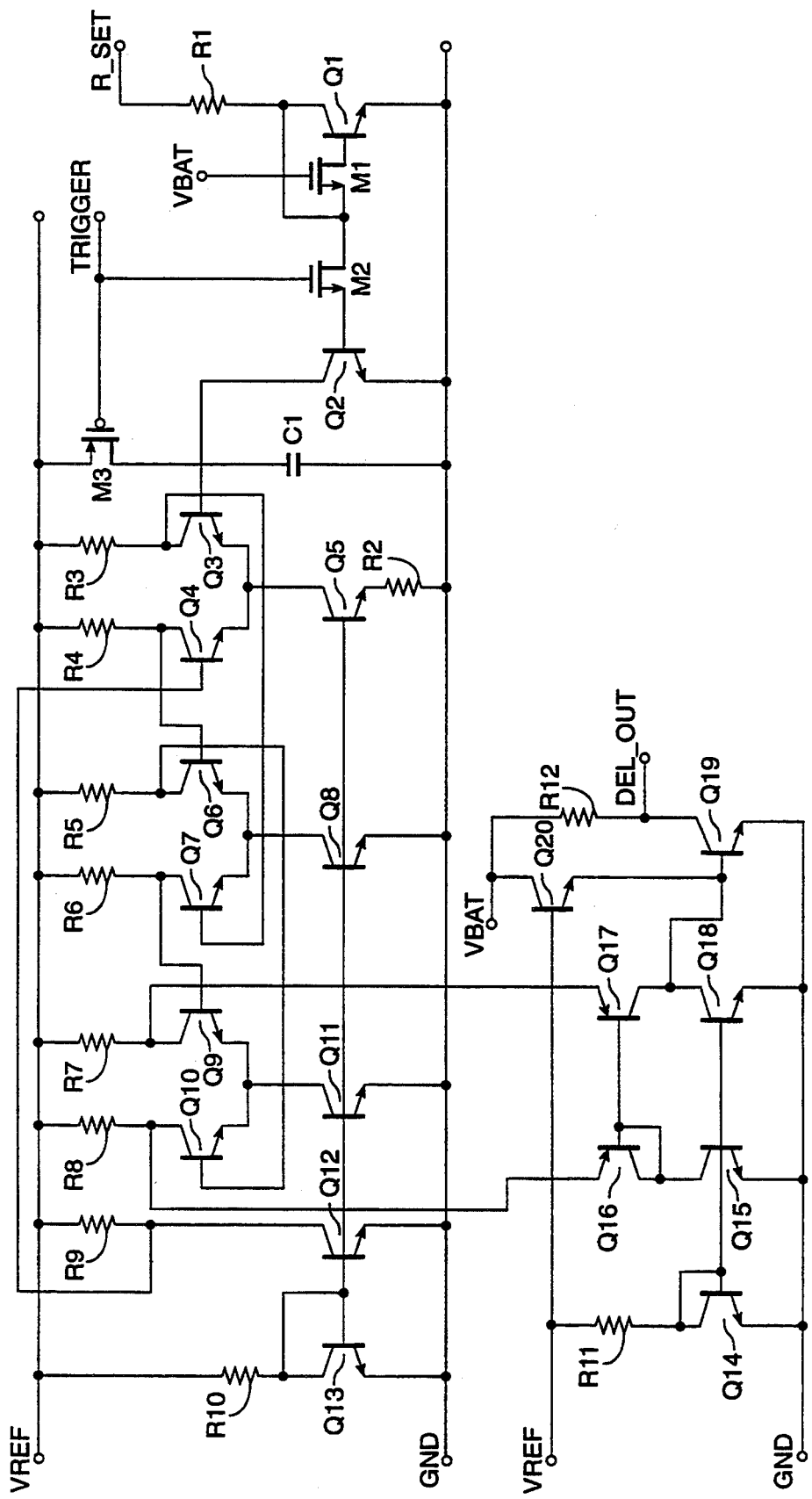
FIG. 16 is a block diagram of the variable delay circuit of FIG. 15.

FIG. 16 shows in detail the circuit of the variable delay circuits VDEL1 and VDEL2 used in the one-shots of FIG. 15. There is a circuit for fast charge (M3) and slow discharge (Q2) of cap C1, and a comparator circuit similar to the one in FIG. 12, with three cascaded differential amplifiers with resistive loads and a single ended output level shift, which is one half of the differential level shift shown in FIG. 13. Resistor R10 and Q13 set a bias voltage for current sources Q5, Q8, Q11 and Q12. Q12 and R9 set a reference level for the comparator input. External resistor R1 of FIG. 1 and FIG. 5 is connected from RSET to VRG. That external resistor, in series with R1 of FIG. 16, sets the bias current in transistor Q1. When the TRIGGER input is low mosfet M3 has charged capacitor C1 to voltage VRG, and the OUTPUT is high. When the TRIGGER input goes high, M3 turns off and Q2 turns on, discharging capacitor C1 with a current equal to the bias current in Q1. Thus the bias current set by the external resistor sets the time rate of change of the voltage on capacitor C1. When the voltage on C1 drops below the comparator reference level (approximately VRG-100 mV in this case) the OUTPUT will go low. When TRIGGER goes low, M3 charges C1 quickly and the circuit is ready for another trigger pulse. The one-shot function is achieved by placing the variable delay circuits VDEL1 and VDEL2 into reset loops on flip-flops G2 and G20, respectively, all of FIG. 15.

Figure 17:
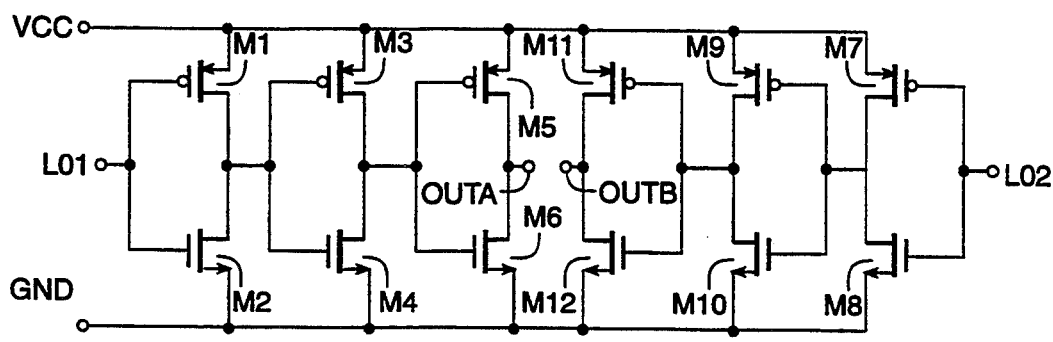
FIG. 17 is a schematic drawing of the output driver circuit of FIG. 1.

FIG. 17 shows the schematic diagram of the output driver block 30 in FIG. 1, which consists of two tapered chains of three inverters. The first chain is formed with PMOS transistors M1, M3, M5 and NMOS transistors M2, M4, M6. Similarly the second chain is formed with M7, M9, M11 and M8, M10, M12. The basic task of the circuit is to amplify the full-swing pulse width modulated square waves at its inputs LO1 and LO2 to a current level sufficient to drive conventional transducers connected between its outputs RC1 and RC2. Using a tapered configuration in the chains assures that no significant capacitive load is presented to the driving stage at the inputs while achieving the low ON resistance at the outputs required to drive the transducers with a maximum voltage swing. The opposite phase outputs swing within a few tens of millivolts of VCC and GND buses and as a consequence, a transducer connected between RC1 and RC2 sees a differential swing of approximately twice the supply voltage. The hearing aid transducers show an inductive behavior at high frequencies which helps to lower the high frequency losses by returning a considerable portion of high frequency energy back to the battery through the low ON resistance of the output MOS transistors. However, the audio frequency components of the pulse width modulated signal at the outputs RC1 and RC2 are converted back to the audible signals by the transducer.

Figure 18:
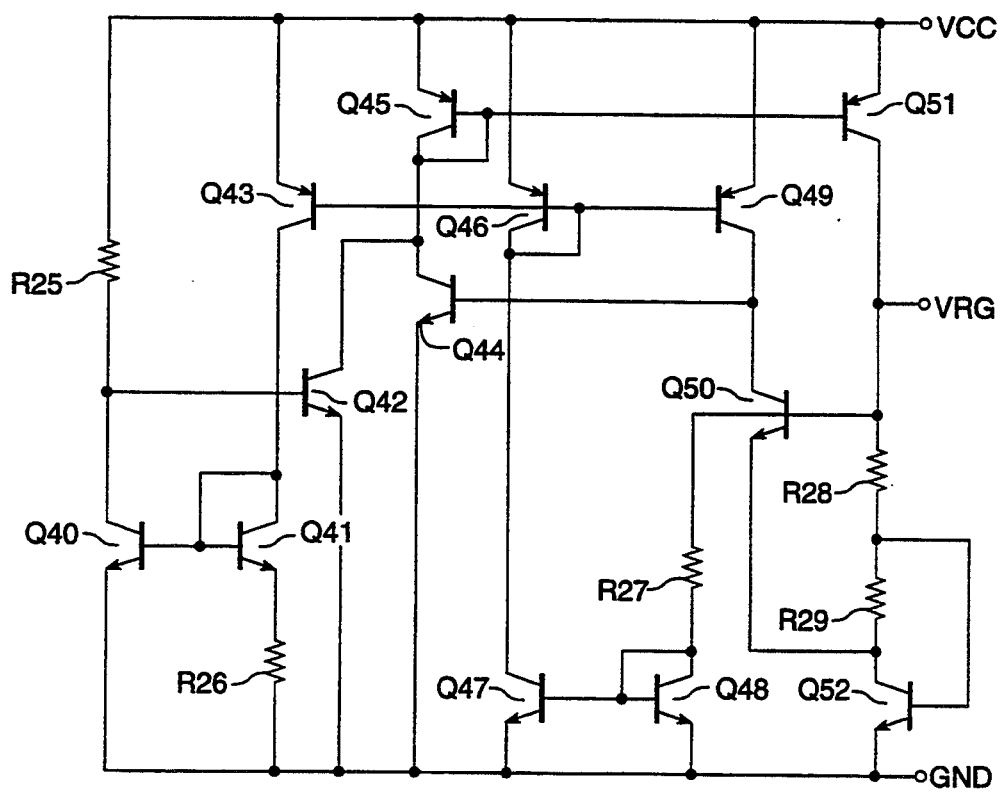
FIG. 18 is a schematic drawing of the voltage regulator circuit of FIG. 1.

The voltage regulator 20 of FIG. 1, supplying the regulated power to most of the internal circuitry is schematically illustrated in FIG. 18. The output voltage at node VRG is set by the base-emitter voltage of Q52 and by a fraction of the base-emitter voltage of Q50. The feedback loop keeping the output voltage regulated consists of Q50, Q44, Q45 and Q51. Q47, Q48 and R27 are used to set a current bias for diode connected Q46, which in turn produces the bias voltage for the current source transistors Q43 and Q49. Current source transistor Q49 operates as an active load at the collector of Q50. Q43, along with Q40, Q41, Q42, R25 and R26 forms the start-up circuit which ensures that the circuit properly starts to operate when the battery voltage is first applied between VCC and GND buses. The regulator is stabilized with an external bypass capacitor connected between VRG and GND buses (CE1 of FIG. 1). By using a voltage derived from the bipolar transistor's base-emitter voltage in the generation of the regulator output voltage, tracking of VRG with the headroom requirements of the internal circuitry is maintained for a wide range of process and operating temperature changes.

Supplying most of the internal circuitry from a regulated voltage ensures stable operation of the integrated circuit for a wide range of battery internal impedance values. Stability problems arise from the voltage drop across the battery internal impedance and worsen with high output levels. The problem is even more pronounced at low frequencies for the transducer at the output being driven by a voltage source, which is the case with the present invention. The impedances of transducers tend to decrease significantly as the driving signal frequency is lowered. If the driving signal amplitude remains constant, this impedance loss means more current flowing through the transducer, which in turn would cause a higher value of voltage drop across the battery internal impedance. This signal can feed back to the front end circuits and can cause signal distortion and system instability. The problem may be solved by filtering out the unwanted components from the power supply lines to the front-end blocks (the front end blocks are oscillator 22, integrator 24, comparator 26 and half of level converter 28). The most common way of filtering is to form a simple lowpass filter with one resistor and a capacitor in series with the supply line. However, as the signal frequency is lowered more filtering is needed which, in turn, means higher RC time constants for the filter. The resistor cannot be increased at will, its value being limited by the maximum allowable voltage drop across it. Thus, more filtering at low frequencies requires a higher value capacitor, which is at the same time physically bulkier. However, the solution to the stability problem offered with the present invention uses a voltage regulator which can be stabilized by a relatively low valued capacitor and which intrinsically holds regulation in the low frequency domain, totally isolating the noisy power supply lines from the front-end circuitry. At the high frequency range, where the regulator's response is slow when compared to the fast transients on the supply lines, the necessary filtering is performed by the stabilization capacitor CE1 between the voltage regulator output VRG and GND buses.

In addition to this, an extra precaution is taken in the internal circuitry by extensive use of balanced architectures keeping the common mode rejection high to reject the disturbances coming through the supply lines. These factors, altogether, ensure stable operation of a hearing aid system employing the present invention, for a wide range of battery impedance, signal amplitude and signal frequency conditions.

The overall circuit is characterized by a low signal distortion level of 0.5%, typically. The distortion at high output levels is typically 5%. The voltage gain of the integrated circuit from the audio input to the output is typically 24 dB. The current consumption is typically 250 µA. The operating voltage range is from 1.15 to 1.60 volts. The regulator output voltage for external components is typically 1 volt.

The internal voltage regulator can also be used to power external components such as microphones and adequately designed preamplifiers, eliminating the necessity of using an external resistor-capacitor (RC) low-pass network which would otherwise be needed to filter out the unwanted signals from the battery line.

As will be understood by those familiar with the art, the present invention may be embodied in other specific forms without departing from the spirit or essential characteristics thereof. For example, more or less than four stages could be used in comparator 26. Accordingly, the disclosure of the preferred embodiment of the invention is intended to be illustrative, but not limiting, of the scope of the invention which is set forth in the following claims.

What is claimed is:

1. An apparatus comprising:
   a class-D pulse width modulation amplifier including
   a first comparator for producing an input pulse; and
   a second comparator for producing a clock period; and
   an output limiter including
      first means, coupled to said pulse width modulation amplifier, for producing a pulse proportional to said input pulse from said pulse width modulation amplifier,
      second means, coupled to said first means, for limiting an output pulse of said first means to a predetermined maximum length, and
      control means, coupled to said pulse width modulation amplifier and said first means, for generating a pulse to said first means in the absence of a pulse from said pulse width modulation amplifier during said clock period of said pulse width modulation amplifier.

2. An apparatus comprising:
   a class-D pulse width modulation amplifier including
   a clock divider having a first phase output and a second phase output,
   a comparator coupled to said first phase output for producing an input pulse, and
   an output line coupled to said second phase output to provide a clock period; and
   an output limiter including
      first means, coupled to said pulse width modulation amplifier, for producing a pulse proportional to said input pulse from said pulse width modulation amplifier,
      second means, coupled to said first means, for limiting an output pulse of said first means to a predetermined maximum length, and
      control means, coupled to said pulse width modulation amplifier and said first means, for generating a pulse to said first means in the absence of a pulse from said pulse width modulation amplifier during said clock period of said pulse width modulation amplifier.

3. An output limiter for a class D pulse width modulation amplifier comprising:
   a first one shot coupled to said pulse width modulation amplifier;
   a first NOR gate having a first input coupled to an input of said first one shot and a second input coupled to an output of said one shot;
   a second one shot having an input coupled to an output of said first NOR gate;
   a second NOR gate having a first input coupled to an output of said first NOR gate and a second input coupled to an output of said second one shot; and
   a variable resistor, coupled to said first and second one-shots, for limiting an output pulse of said first and second one-shots to a predetermined maximum length.

4. The output limiter of claim 3 further comprising:
   control means, coupled to said pulse width modulation amplifier and said first means, for generating a pulse to said first means in the absence of a pulse from said pulse width modulation amplifier during a clock period of said pulse width modulation amplifier.

5. The output limiter of claim 4 wherein said class-D pulse width modulation amplifier includes:
   a first comparator for producing said input pulse; and
   a second comparator for producing said clock period to said control means.

6. An output limiter for a class-D pulse width modulation amplifier comprising:
   first means, coupled to said pulse width modulation amplifier, for producing a pulse proportional to an input pulse from said pulse width modulation amplifier;
   second means, coupled to said first means, for limiting an output pulse of said first means to a predetermined maximum length and a predetermined minimum length; and
   control means, coupled to said pulse width modulation amplifier and said first means, for generating a pulse to said first means in the absence of a pulse from said pulse width modulation amplifier during a clock period of said pulse width modulation amplifier.

7. The output limiter of claim 6 wherein said second means comprises a variable resistor.

8. The output limiter of claim 6 wherein said class-D pulse width modulation amplifier includes:
   a first comparator for producing said input pulse; and
   a second comparator for producing said clock period to said control means.

9. The output limiter of claim 6 wherein said class-D pulse width modulation amplifier includes:
   a clock divider having a first phase output and a second phase output;
   a comparator coupled to said first phase output for producing said input pulse; and
   an output line coupling said second phase output to said control means to provide said clock period.

10. An output limiter for a class D pulse width modulation amplifier comprising:

first means, coupled to said pulse width modulation amplifier, for producing a pulse proportional to an input pulse from said pulse width modulation amplifier;

second means, coupled to said first means, for limiting an output pulse of said first means to a predetermined maximum length; and control means, coupled to said pulse width modulation amplifier and said first means, for generating a pulse to said first means in the absence of a pulse from said pulse width modulation amplifier during a clock period of said pulse width modulation amplifier.

* * * * *